United States Patent [19]

Du Bois et al.

[11] 4,253,280

[45] Mar. 3, 1981

[54] METHOD OF LABELLING DIRECTIONAL CHARACTERISTICS OF AN ARTICLE HAVING TWO OPPOSITE MAJOR SURFACES

[75] Inventors: Loring E. Du Bois, Kansas City; Lawrence D. Simpson, Lee Summit, both of Mo.

[73] Assignee: Western Electric Company, Inc., New York, N.Y.

[21] Appl. No.: 24,222

[22] Filed: Mar. 26, 1979

Related U.S. Application Data

[62] Division of Ser. No. 863,107, Dec. 22, 1977, Pat. No. 4,170,021.

[51] Int. Cl.³ .............................................. B24B 1/00
[52] U.S. Cl. .............................. 51/283 R; 125/13 R; 225/96.5; 357/55
[58] Field of Search .................. 225/96.5, 103, 2; 125/12–15; 51/283; 357/55

[56] References Cited

U.S. PATENT DOCUMENTS

| | | |
|---|---|---|
| 1,022,818 | 4/1912 | Bogdanffy . |
| 2,609,429 | 9/1952 | Law . |
| 2,843,809 | 7/1958 | Varela . |
| 2,892,530 | 6/1959 | Fox . |
| 2,970,730 | 2/1961 | Schwarz . |
| 3,040,489 | 6/1962 | DaCosta . |
| 3,067,485 | 12/1962 | Ciccolella ............................. 29/583 |
| 3,083,441 | 4/1963 | Little ..................................... 29/583 |
| 3,171,068 | 2/1965 | Denkewalter . |
| 3,201,665 | 8/1965 | Venables . |
| 3,235,779 | 2/1966 | Zacharellis . |
| 3,240,571 | 3/1966 | Michelitsch . |
| 3,260,634 | 7/1966 | Clark . |
| 3,341,928 | 9/1967 | Naumann . |
| 3,449,647 | 6/1969 | Scott . |
| 3,470,427 | 9/1969 | Kawaji . |
| 3,480,845 | 11/1969 | Ruchardt . |
| 3,585,714 | 6/1971 | Li ......................................... 29/583 |
| 3,589,938 | 6/1971 | Blewett . |
| 3,890,178 | 6/1975 | Lebailly ............................... 29/583 |

FOREIGN PATENT DOCUMENTS

| | | |
|---|---|---|
| 876819 | 9/1961 | United Kingdom . |
| 936776 | 9/1963 | United Kingdom . |
| 1010697 | 11/1965 | United Kingdom . |
| 1036167 | 7/1966 | United Kingdom . |
| 1288278 | 9/1972 | United Kingdom . |
| 1312144 | 4/1973 | United Kingdom . |
| 1319079 | 5/1973 | United Kingdom . |

OTHER PUBLICATIONS

IBM Tech. Disclosure Bulletin, vol. 16, No. 9, Feb. 1974, p. 2800.
"Soldering . . . Chips" Tech. Digest No. 44, Oct. 1976, pp. 15–16, D. D. DeMuzio et al.
"Mass Soldering . . . Chips" Tech. Digest No. 33, Jan. 1974, pp. 9–10, R. B. Bankes et al.
"Varistor . . . Oscillator", Electronics, Jul. 28, 1961, pp. 44–47, Masami Uno.

*Primary Examiner*—Harold D. Whitehead
*Attorney, Agent, or Firm*—W. O. Schellin

[57] ABSTRACT

In the production of varistors, diode chips are cut from a p-n sheet-diffused semiconductor wafer. Instead of having conventional rectangular shapes, the chips have a rhomboidal shape. This makes the shape of the chips asymmetric in that one surface of each chip becomes a distinguishable mirror image of its other surface. The direction of the p-n junction in the wafer is oriented with respect to the shape of the chips to be cut to place the same conductivity type region adjacent to the same rhomboidal shape of the surface. As a result, the polarity of the chips, or the direction in which the p-n junctions are oriented within the chips, becomes identifiable by the shape of the chips. This substantially aids in sorting, inspecting, assembling and other handling operations performed on the chip. The chips can, for instance, be inspected visually to determine whether the p-type or the n-type doped portion of the chips are facing away from a supporting surface. Moreover, mechanical means sort the chips into two groups each consisting of chips of the same polarity or orientation of their p-n junctions with respect to a common support plane. Once sorted, the chips are loaded with such known orientation of their p-n junctions into a mass assembly fixture where they become solder-bonded to electrical leads to form the varistors.

5 Claims, 17 Drawing Figures

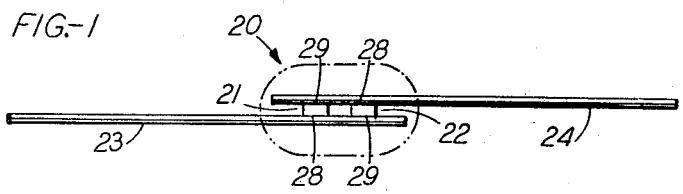
FIG.-1
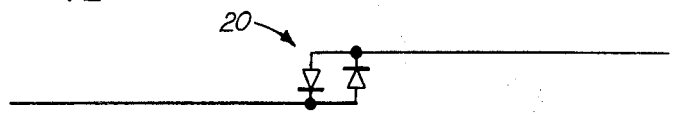
FIG.-2
FIG.-3
(PRIOR ART)
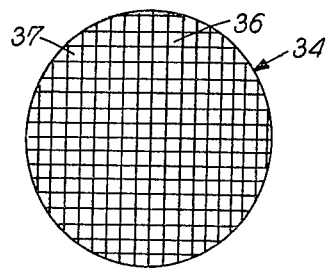
FIG.-4
(PRIOR ART)
FIG.-5
(PRIOR ART)
FIG.-6
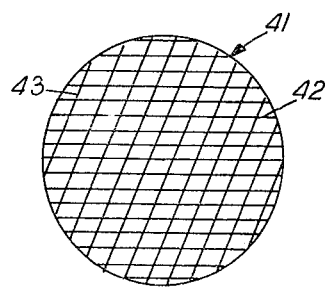
FIG.-7
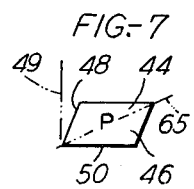
FIG.-8
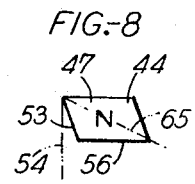

METHOD OF LABELLING DIRECTIONAL CHARACTERISTICS OF AN ARTICLE HAVING TWO OPPOSITE MAJOR SURFACES

This is a division, of application Ser. No. 863,107 filed Dec. 22, 1977 now U.S. Pat. No. 4,170,021.

BACKGROUND OF THE INVENTION

1. Field of the Invention

This invention relates generally to handling articles having intrinsic polar characteristics. More particularly, the invention relates to identifying the orientation of such characteristics within the articles and to sorting the articles into groups of the same orientation of the characteristics within the articles. The invention is of particular interest to the assembly of semiconductor chips, such as diodes. For instance, in the manufacture of varistors, it becomes necessary to group the diodes according to the orientation of their p-n junctions prior to the attachment of leads to the diodes.

The present invention is discussed with respect to sheet-diffused diode chips. However, it should be understood that any reference in the disclosure to this product is for illustrative purposes only, and that such reference is not intended to limit the scope of the invention.

2. Discussion of the Prior Art

Conventionally, semiconductor devices are formed in great numbers as individual units in a single wafer. The wafer is subjected to a series of processing steps. The number and the sequence of these steps vary, depending upon the complexity of the final product. Upon completion of the steps the wafer is divided into the individual units. These units are commonly referred to as dice or chips.

Depending on the previous manufacturing steps, the chips may be complex integrated circuits or they may be simple diodes. One method of manufacturing diodes is to generate within the body of the wafer a single rectifying p-n junction parallel to the two major surfaces of the wafer. The junction separates two doped semiconductor regions or domains, each of opposite conductivity type with respect to the other. Each domain lies adjacent to and in contact with one of the major surfaces. The domains are formed by well known methods. For instance, impurities of one conductivity type, such as phosphorous are diffused from one surface into the semiconductor wafer which is comprised of single-crystal silicon material, predoped with impurities of the opposite conductivity type, such as boron.

The wafer then becomes a single, large diode. When both major surfaces of the wafer are metallized, they become the two terminals of the diode. Subsequent to the metallization in one of various conventional ways the diode wafer is separated into a number of small diode chips. Each of these chips has diode characteristics since each chip includes its respective portion of the previously formed p-n junction between its two major surfaces. Diodes formed by the described process of uniformly diffusing impurities through the wafer to form a single large diode and then dividing the wafer into small diode chips are referred to as sheet-diffused diodes. A number of known methods are available to divide the wafer into the chips.

One of these methods for the wafer entails selectively masking one of its major surfaces with small steel discs. The surface is then subjected to a grit blast process which erodes material between the discs until the wafer is completely separated into a plurality of small islands, each one of which is covered by one of the small discs. These discs are usually of circular shape and the erosion process leaves each of the formed diode chips with slightly sloped edges resulting in the major surfaces of the chips being of different sizes.

Another known method of separating the wafers into chips involves scribing the wafer with two sets of parallel lines. The lines of one set intersect the lines of the other. The wafer is then flexed to break it along the scribed lines. When it is desired to separate the wafer into rectangular chips the line spacing of one set of lines is increased with respect to the line of spacing of the other set.

Another method of separating the chips from the wafer is by sawing the wafer, mounted on a solid support, with what is referred to as a gang saw. A gang saw has a plurality of blades which are mounted in parallel. Two cutting operations by the gang saw, one at right angles to the other, separate each wafer into a plurality of square chips.

Handling the individual chips efficiently in further manufacturing operations becomes a concern because of the small size of the chips and their intrinsic polar characteristics. These further manufacturing operations include the attaching of leads to the metallized terminal areas on the two major surfaces of the chips and the encapsulation of the chips to protect them from environmental influences that could destroy or adversely affect their electrical characteristics. For some products, such as simple diodes, it is not necessary to know the orientation of the p-n junctions within the chips with respect to the leads prior to the encapsulation of the chips. Leads are simply attached to each of the terminal areas and the chips are then encapsulated to form completed devices. The devices are then tested and marked to indicate their polarities, namely, the orientation of the p-n junctions of the diodes within the devices.

In other manufacturing methods, the diode chips are mounted in a known orientation to a header or to a header stud. Then, the second stud or lead is attached to the other side of the chip to complete the diode. These studs or leads may indicate the polarity of the diode. Or the diode may be tested again after encapsulation and marked according to the outcome of the test to indicate orientation of its p-n junction within the finished device.

As can be seen from the last example, it may be desirable to know the orientation of the p-n junction within each of the diode chips before the diodes become encapsulated. Some ways are already available to recognize the orientation of junctions within the chips. For instance, when diodes are not sheet diffused, but instead junctions are diffused as discrete regions, one of the terminals of each chip occupies only a portion on one of the major surfaces. This terminal is recognized by a small metal contact dot to which a lead has to be attached.

Also, the separation of sheet diffused diodes by grit blasting can be carried out to make the orientation of the p-n junctions in the chips identifiable. It simply becomes necessary to orient the direction of the p-n junctions of all wafers so that the surface facing toward the impinging grit lies consistently adjacent to the same conductivity type domain.

If, for instance, the surface associated with the positive conductivity type domain is facing up toward the impinging grit, the grit blasting operation cuts the positive conductivity type or p-type surface except where it is protected by the small steel discs. The opposite major surface, however, facing away from the impinging grit is cut only to the extent that it takes to cut through the thickness of the wafer. The separated diode chips take the shape of truncated cones the two major surfaces of which are spaced by sloped edges. The polarity or orientation of the p-n junction within each diode chip is known by the size of one major surface of the chip with respect to the other.

When, however, sheet-diffused diodes are separated from the wafer by either scribing and breaking or by sawing their edges are substantially perpendicular between the two major surfaces. When both major surfaces of the diodes are coated with the same type of contact metal, the polarity of the diodes, meaning the orientation of the p-n junctions within the diode chips, is not readily ascertainable. In some prior art processes in which the orientation of the diodes has to be known to permit the diodes to be correctly assembled, electrical testing is used to determine the orientation of the diodes.

For instance, in a process for making a varistor, two diodes are assembled in parallel between two leads. However, for the varistor to have its desired characteristics, the polarities of the diodes are reversed with respect to each other. The assembly of the diodes presupposes knowledge about the orientation of the diodes. p In the past, these diodes have been assembled by a multi-station and multi-function apparatus. The apparatus receives the diode chips from a conventional vibratory feeder bowl. The chips vibrate in a single file along a track to a test point. At that point a probe is lowered toward the track. The probe contacts the chip located at the test point and performs a test to its polarity of its p-n junction. Depending on the outcome of this test, the chip is transferred either to one or another track. Since this test is performed on all chips in sequence, they become sorted into two groups depending on the orientation of the p-n junction in each of the chips.

The two tracks feed a magazine of a multi-position assembly apparatus. The apparatus includes a multi-position turntable. At a first position of the turntable, a first lead is placed onto an assembly fixture. Several of the fixtures are located evenly spaced along the periphery of the turntable. The turntable indexes and advances the fixtures in sequence to a second position.

At the second position There a dual vacuum arm picks up two chips, one from each of the two tracks and places them next to each other over one end of the first lead. Then, a second lead is placed with one end over the top of the two positioned chips so that the two leads extend away from the chips and from each other. As the table indexes to advance each of the fixtures so loaded with leads and chips in sequence to a solder reflow station, the chips and the leads become soldered to each other to form the device.

The operation of such an assembly apparatus is, of course, complex. The apparatus executes many mechanical functions and requires many linkages. A malfunction in any of the linkages requires a total shutdown of the assembly operation. Consequently, the average hourly output of the apparatus is often decreased by downtimes. It is, therefore, desirable to simplify the operation of assembling sheet diffused diodes into varistors.

SUMMARY OF THE INVENTION

The present invention contemplates an article having two opposed surfaces and poles located within the article and oriented in one of two possible directions substantially perpendicular to the surfaces. Each of the surfaces has a distinct shape with respect to the other, and one of the shapes is associated with one of the poles. The shapes consequently, indicate the direction in which the poles are oriented within the article.

The invention particularly contemplates methods of labeling the orientation of directional characteristics extending between two major opposite surfaces on an electronic article. Such labeling involves a preselection of an asymmetric surface shape and a mirror image thereof as two distinct geometric surface shapes, each shape to identify a particular pole of the characteristics within the article. Edges are then formed substantially perpendicular to each of the surfaces to generate at one of the major surfaces the preselected asymmetric surface shape, and at the opposite major surface the mirror image of such surface shape. By associating a predetermined one of the shapes with a particular pole, the orientation of the characteristics within the article becomes labeled.

BRIEF DESCRIPTION OF THE DRAWING

The following detailed description will be better understood when it is read in conjunction with the appended drawing wherein:

FIG. 1 is a simplified side view of a symmetrical, rectifier varistor as a typical example of a product to which the invention applies;

FIG. 2 is a schematic diagram of the device shown in FIG. 1;

FIG. 3 is a top view of a semiconductor wafer which is scribed in accordance with prior art practices;

FIGS. 4 and 5 show chips broken from the prior art wafer of FIG. 3;

FIG. 6 is a semiconductor wafer which has been described in accordance with the present invention;

FIGS. 7 and 8 show chips separated from the wafer of FIG. 6;

DETAILED DESCRIPTION

1. The Device in General

Figure 9:
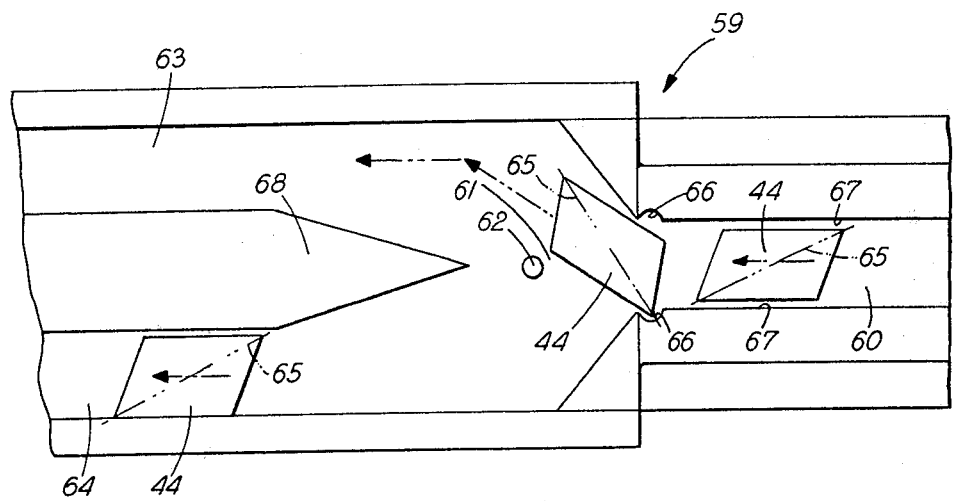
FIG. 9 shows simplified top view of an apparatus for mechanically separating articles into two groups.

The present invention is particularly applicable to a symmetrical diode varistor which is shown in a somewhat simplified manner in FIG. 1. The varistor, which is designated generally by the numeral 20, includes two semiconductor diode chips 21 and 22. The chips 21 and 22 are connected in parallel between two leads 23 and 24.

FIG. 2 is a circuit diagram of the device 20 shown in FIG. 1. For the device 20 to function as an arc suppressor the diodes 21 and 22 are connected with opposite polarity across the leads 23 and 24. The diodes 21 and 22 are, of course, by themselves variable resistors or varistors. However, their electrical characteristics are nonsymmetrical or polar. But the two diodes 21 and 22 connected in the manner shown in FIG. 2 give the resulting varistor symmetrical characteristics. The voltage-to-current relationship of the device become the same regardless of which of the two leads 23 or 24 is made positive with respect to the other.

The device 20 shown in FIGS. 1 and 2 is capable of sustaining a specified threshold voltage between its terminals represented by the two leads 23 and 24. Beyond the specified threshold voltage, the resistance of the device 20 decreases as either one or the other of the two diodes 21 and 22 become saturated and start to conduct current. These characteristics make the device an effective surge protector. The device is used, for instance, in telephone sets to reduce the sound level of clicks produced by dialing. Also other current impulses which may appear on the line are reduced in intensity.

Again referring to FIG. 1, each of the two diodes 21 and 22 have two major surfaces 28 and 29. These surfaces represent electrically the anode and cathode of each of the chips. A p-n junction is located somewhere between these two surfaces 28 and 29 to divide a body portion of positive conductivity type from a body portion of negative conductivity type.

Normally, such chips as the chips 21 or 22 may be assembled to leads without prior testing. After they are assembled and encapsulated their polarity may be ascertained by electrical testing. The final devices are then marked to identify the polarity of the chips with respect to the leads of the devices. Clearly, such an assembly procedure is not possible with the device 20. The polarity of the chips 21 and 22 must be known prior to the time that they are assembled to the leads. For all devices 20, the orientation of one of the diodes such as the chip 21 must be opposite to that of the other. Consequently, the diode chips 21 and 22 have to be assembled with the polarity of each of the chips 21 and 22, e.g., the direction in which the p-n junction is oriented within the body of each chip 21 or 22, facing in a predetermined direction with respect to the leads.

Prior Art Chips

In the prior art, sheet diffused semiconductor chips are formed from large wafers by separating the wafers into smaller devices. These prior art methods are best explained in reference to FIGS. 3, 4 and 5. Referring to FIG. 3, there is shown a typical top view of a semiconductor wafer 34. The wafer 34 is shown with a major surface 36 facing upward. For illustrative purposes, the major surface 36 lies adjacent a p-type body domain of the semiconductor material within the wafer. The p-n junction is located somewhere between the two major surfaces of the wafer. When the wafer 34 is cut into separate chips 37, each chip 37 of the wafer 34 becomes a diode by itself with a p-type terminal facing upward.

The chips 37 are separated from the wafer 34 in a conventional manner by scribing and breaking the wafer 34. Another method of separating the chips 37 from the wafer 34 is by cutting the wafer with parallel cuts made in two different directions. In the past, these cut chips 37 have been formed without an identification of the polarity or orientation of their p-n junctions.

FIGS. 4 and 5 show the chip 37 as a typical chip separated from the wafer 34 in accordance with prior art practices. FIG. 4 shows the chip 37 having the same orientation as the orientation of the wafer 34. FIG. 5 shows the chip turned over to expose surface adjacent to the negative conductivity type domain of the chip 37. The physical configuration of the chip 37 in FIG. 4 is the same as that of the chip in FIG. 5.

To determine the orientation of the p-n junction of the chips 37 prior to their assembly into a device such as the device 20, the prior art uses individual electrical tests.

For instance, U.S. Pat. No. 3,341,928 to Naumann discloses an apparatus for testing, sorting and assembling articles. The apparatus uses a movable vacuum needle to contact each of a number of the chips 37 in sequence. Electrical contact made by the needle with each chip 37 feeds a signal to the apparatus. On the basis of the signal the orientation of the p-n junction in the chip becomes known. The vacuum pickup test probe then moves the chip 37 horizontally either into an n-type track or into a p-type track depending on the orientation of the p-n junction within the chip.

Chips in Accordance with the Invention

Referring now to FIG. 6, a wafer 41 shows a plurality of parallel horizontal separation lines 42, similar to the horizontal separation lines in FIG. 3. Separation lines 43, however, are formed at an angle other than a right angle. Also, the spacing between the separation lines 43 is distinctly altered from the spacing of the separation lines 42.

Each chip 44 separated from the wafer 41 by the cuts spaced and oriented in this manner becomes a parallelepiped. A parallelepiped is defined as a prism with rhomboidal bases. Chips 44 cut from the wafer 41 in this manner have two distinctly identifiable surfaces 46 and 47 for their bases. These surfaces 46 and 47 are shown in FIGS. 7 and 8 respectively.

In FIG. 7, the chip 44 is shown with the major surface 46 facing up. The major surface 46 lies adjacent the p-type semiconductor material as a first pole of the chip and is identified by a shorter edge 48 being rotated clockwise from a vertical line 49 drawn with respect to a longer edge 50.

In FIG. 8, the surface 47 adjacent the n-type material, e.g., the second pole, of the semiconductor chip 44 is distinguished from the surface 46 by having a shorter edge 53 rotated counterclockwise from a vertical line 54 drawn with respect to the chip's longer edge 56. By consistently orienting the direction of the p-n junction in each wafer 41 with respect to the direction in which the separation lines 42 and 43 are cut, the orientation of the p-n junctions within each chip 44 becomes known. The direction in which the p-n junctions in the chips 44 face become visually identifiable by the shape of the exposed major surface of the chip.

In the preferred embodiment of the invention, the major surfaces 46 and 47 of the chip 44 are oblique parallelograms having nonequal adjacent sides. This geometric shape is also called a rhomboid. The shape is characterized in that it is nonsymmetric about any axis which can be drawn in its plane. Consequently, there is no axis about which the shape of any of the major surfaces can be folded over on itself so that the two folded halves of the shape coincide. This characteristic of having no axis of symmetry is a general requirement for a flat object like the chip 44 to have one surface a distinguishable mirror image of the other. Shapes other than the rhomboidal surfaces 46 and 47 of the chips 44 can have this characteristic. However, the rhomboidal shape is easily obtained by the two sets of separation lines 42 and 43.

The chips 44 described herein are preferably cut from the 41 having a thickness of substantially 0.007 inch. The chips 44 are preferably about 0.035 inch wide with a long edge 50, 56 being about 0.058 inch long. The angle between the two sets of separation cuts has been chosen to be about 68°. These dimensions are, of course, examples of one embodiment only and are not to be understood as being limiting to the scope of the invention.

Sorting the Chips

The rhomboidal shapes of the surfaces 46 and 47 have advantages other than merely to permit an observer to visually determine the orientation of the p-n junction in the chip 44. It is further possible to use the rhomboidal geometry of the chips 44 to sort the chips 44 into two groups of like orientation of the p-n junctions without individual electrical testing.

Figure 10:
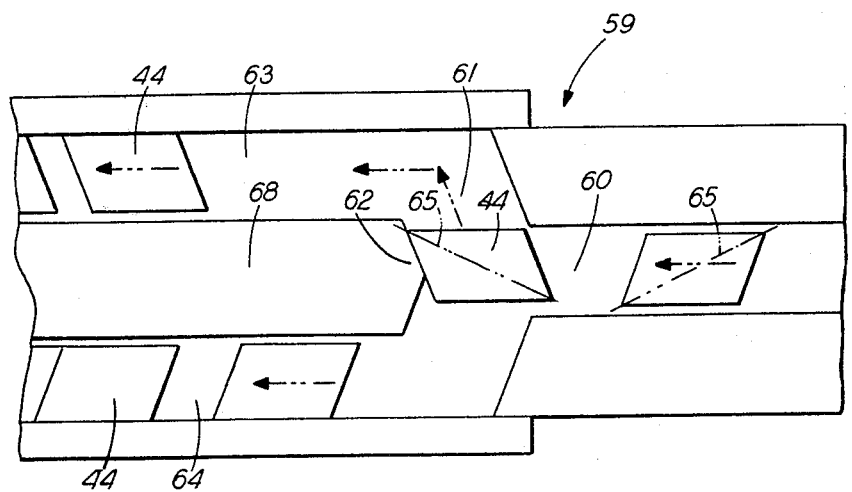
FIG. 10 shows a top view of an alternate embodiment of the apparatus of FIG. 9.

FIGS. 9 and 10 show two representative embodiments of a mechanical sorting track which are designated generally by the numeral 59. The purpose of the track is to separate the chips 44 into the two groups as the chips advance along the track. A preferred way to advance the chips 44 in a single row along a feeder track 60 is to vibrate the track 60 at an angle upward in the direction in which the chips are to be advanced. Other ways of advancing the chips 44 are, of course, acceptable. For instance, the chips can be moved by slanting the track 60 sufficiently to permit gravity to cause the chips to slide along the track. Also, a combination of slanting the track 60 and vibrating it may be used to move the chips, or to move other articles along a similar track.

An alternate mechanism for causing articles such as the chips 44, or even other articles, to move along the track 60 is to employ a cushion of air between the articles and the surface of the track. To generate an air cushion between the articles and the base of the track, air is usually supplied through apertures (not shown) which are located in the base. The apertures are usually slanted with respect to the base of the track 60 to direct the air in the direction in which it is desired to move the articles. Air escaping through the apertures generates the cushion and pushes the articles in the desired direction.

In FIGS. 9 and 10, the chips 44 advance along the single feeder track 60 to a branch or fork 61. At the fork 61, a center obstruction 62 in the track 60 causes the chips 44 to be deflected into one or another of two parallel branch tracks 63 and 64. Whether the chips 44 are deflected to the right into the branch track 63 or to the left into the track 64 depends on the direction in which the major axis 65 of each chip 44 deviates from the direction in which the chip travel.

Referring to FIG. 7, when the p-type material of the chip 44 faces up the major axis 65 deviates to the left with respect to the long edge 50 of the chip. On the other hand, when the n-type material faces up, as shown in FIG. 8, the major axis 65 deviates toward the right from the direction in which the long edge 56 extends.

The relationship between the orientations of the p-n junction in each chip 44 and its topographical shape, allows the chips 44 to be sorted mechanically into two groups, one group having their p-n junctions in each chip oriented in the opposite direction from those in the other group.

In FIG. 9, the chip 44 shown at the fork 61 corresponds in the orientation of its p-n junction to the chip 44 shown in FIG. 8. The major axis 65 deviates to the right from its direction of travel in the track 60. The chip is being deflected into the right branch track 63. Of the chips 44 preceding and following the chip at the fork 61, the p-type material faces up and the major axes deviate to the left from their direction of travel. Those chips 44 with their major axes 65 deviating toward the left are deflected toward the left by the obstruction 62.

The embodiment of the sorting track 59 shown in FIG. 9 depicts a rotation of the chips 44 as they are deflected into the branch tracks 63 and 64. The rotation of the chips 44 requires recesses 66 for clearances in both walls 67 near the end of the track 60. The recesses 66 permit the chips 44 to rotate or pivot toward one or the other side when the lead surfaces of the chips engage the obstruction 62. It is not necessary that the center obstruction 62 is a pin as shown in FIG. 9. It can also be the leading edge of a dividing barrier 68 between the two tracks 63 and 64.

The width of the two tracks 63 and 64 is initially wider than the width of the track 60, again to facilitate the rotation of the chips until they reach the straight portions of the tracks 63 and 64. From there, the chips 44 advance to a pickup station (not shown).

As the chips 44 are continuously replenished at the front end of the feeder track 60, the chips 44 become divided at the fork 61 into groups of chips having like orientation. Each track (63 and 64) tends to fill up with chips 44 having p-n junctions oriented in the same direction.

At the pickup station, the chips 44 are loaded, preferably two at a time, into an assembly fixture by an apparatus similar to that shown in U.S. Pat. No. 3,341,928 to H. K. Naumann. The tracks 63 and 64 are consequently preferably spaced at a distance which is the same as the spacing of the two chips 44 in the assembly fixture and in the final device 20. The spacing of the tracks 63 and 64 is accomplished by choosing the correct width for the dividing barrier 68.

Referring to FIG. 10, there is shown a second, alternate embodiment of the sorting track 59 of FIG. 9. The track 59 of FIG. 10 is distinguished from that in FIG. 9 by causing the chips 44 to undergo a translational displacement to become separated into groups at the fork 61. The chips 44 are initially advanced along the feeder track 60. However, at the fork 61, the chips 44 are not rotated to be directed into their respective branches 63. Instead a transverse movement in either one or the other lateral direction is superimposed on the general forward movement of the chip. This transverse movement guides the chips 44 either into the track 63 or into the track 64.

Again, the slope on the leading edge of the rhomboidal shape determines which one of the two branch tracks 63 or 64 the chips 44 will enter. This embodiment is, however, not preferred for use with vibratory motion of the track, since the chips 44 have a tendency to rotate as the leading edge of the chips contacts the center obstruction 68. However, the embodiment of FIG. 10 may become advantageous when articles such as the chips 44 are intended to be advanced by air jets projected through apertures in the track. Apertures may then direct air outwardly from a longitudinal centerline. Once the article has moved partially to one side or the other of the centerline of the track 60, air jets can then be used to direct the article in translational movement into one track or the other.

Mass Sorting the Chips

Figure 11:
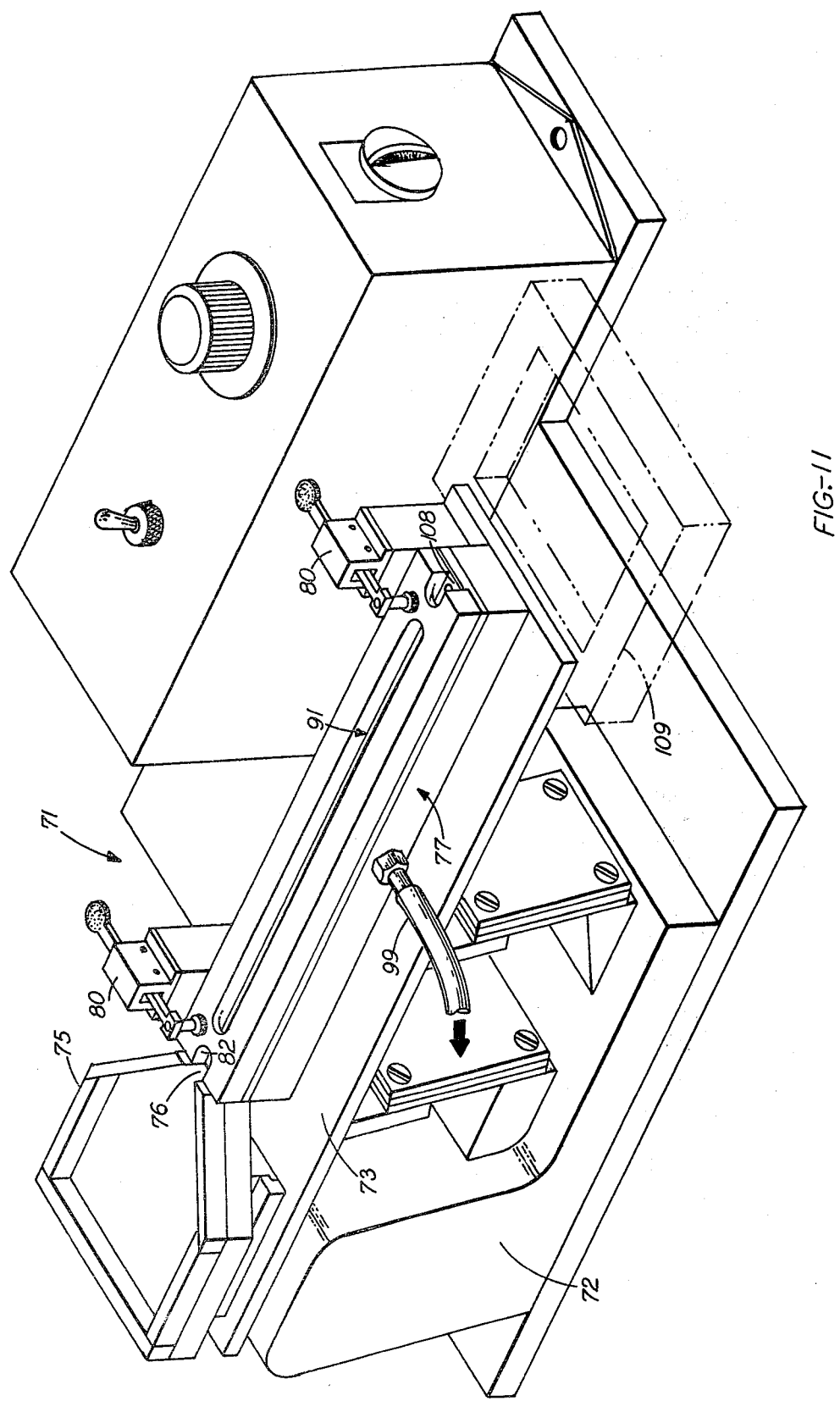
FIGS. 11 and 12 show a preferred sorting and handling apparatus which is used in conjunction with the present invention.

Another apparatus for sorting the chips 44 according to the orientation or polarity of their p-n junctions within the chips is shown in FIG. 11. The apparatus which is designated generally by the numeral 71, differs from the chip sorting apparatus shown in FIGS. 9 and 10 in that it sorts and arranges in an array a plurality of chips to permit mass handling of the chips 44.

The apparatus 71 is powered by a vibrator unit 72. Such a vibrator unit is a known commercial product which can be purchased for instance from Syntron, a division of FMC Corporation. The unit 72 imparts an upwardly directed longitudinal vibrating motion to a vibrating table 73. The vibrating motion of the table 73 is such that loose articles placed on its surface are vibrated from one end, a supply end, to the other. A supply or feeder 75 is mounted to the supply end of the table 73. A discharge opening 76 in the feeder 75 connects to an intake of a vacuum holder 77.

Figure 12:
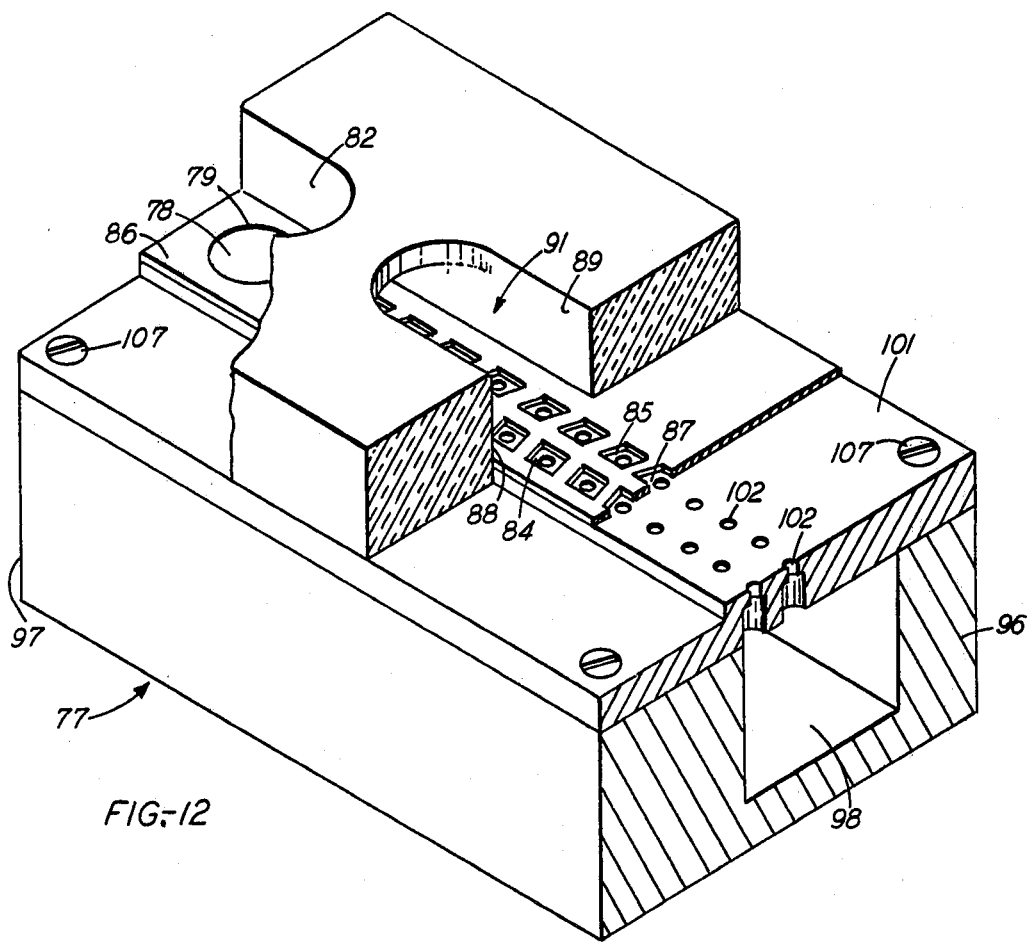

The vacuum holder 77 is removably mounted to the table 73. Alignment pins 78 extend from the vibrating table 73 into corresponding apertures 79 (one of which is shown in FIG. 12) of the vacuum holder 77. Matching of the pins with the apertures 79 aligns the vacuum holder 77 to the feeder 75. When the vacuum holder 77 is seated, the tops of the pins 78 are flush with the vacuum holder 77 to completely fill out the apertures 79. The tops of the pins 78 consequently blend into the outline of the vacuum holder 77. A set of preferably two clamps 80 are rigidly mounted to the table 73. The clamps 80 fasten a guide cover 81 over the vacuum holder 77 and at the same time, rigidly mount the vacuum holder 77 to the table 73.

Details of the vacuum holder are best explained with reference to FIG. 12 as well as to FIG. 11. A longitudinal slot 82 in the guide cover 81 confines the movement of the chips 44 in the lateral direction. This lateral confinement causes the chips 44 to be vibrated over and into two sets of cavities 84 and 85 on the surface of the vacuum holder 77. The cavities 84 and 85 are shallow recesses in a top surface 86 of the vacuum holder 77. In each set, the cavities 84 or 85 are equally spaced in a single row. The cavities 84 of the one set are also located symmetrically opposite from the cavities 85 in the second set.

The shape of each of the cavities 84 and 85 is rhomboidal and its size is slightly larger than that of the chips 44. A bottom surface 87 in each of the cavities is parallel to the top surface 87 of the vacuum holder 77. The depth from the top surface 86 of the holder 77 to each surface 87 is substantially equal to the thickness of the chips 44.

Like the chips 44 with two distinct geometric configurations, the cavities 84 and 85 are also geometrically distinct. The shape of the cavities 84 corresponds to the shape of the chips 44 when their n-type region adjacent the surface 47 faces up; and the shape of the cavities 85 is the mirror image of the cavities 84. Consequently, the cavities 84 are intended to accept only chips 44 which have their n-type regions facing up. Conversely the cavities 85 are intended to be filled only with chips 44 which have their p-type regions facing up.

The spacing between the two sets of cavities 84 and 85 is chosen to correspond to the desired spacing between the chips 44 when assembled into a device, such as the device 20. Walls 88 and 89 of the slot 82 form a channel 91 into which the chips 44 are fed through the discharge opening 76 of the feeder 75. As the chips 44 are vibrated through the length of the channel 91 the cavities 84 and 85 become occupied by chips 44. It has been found that the cavities 84 and 85 become occupied quite efficiently with chips 44 of the desired correct polarity or orientation of their p-n junctions.

FIG. 12 shows the structure of the vacuum holder 77. A vacuum housing 96 has a hollow section. The hollow section extends substantially the full length of the housing 96 except that end plates 97 close off the hollow section at each end to form a vacuum chamber 98. A vacuum connection 99, shown in FIG. 11, communicates with the chamber 98 and extends from the holder 77 to a vacuum source (not shown). An upper wall of the vacuum chamber 98 is formed by a top plate 101. A plurality of regularly spaced passages 102 communicate through the plate 101 between the vacuum chamber 98 and each of the cavities 84 and 85.

The cavities 84 and 85 are apertures formed through a sheet of material 106 of substantially the thickness of the chips 44 by preferably etching or by any other convenient process. The sheet 106 is then permanently bonded to the top plate 101 to form the top surface 86 of the vacuum holder 77. In addition to bonding the sheet 106 to the top plate 101, the top plate 101 is itself preferably bonded to the other parts of the vacuum housing 96 to establish airtight seams. Screws 107 are preferably used in the assembly as a locating means for the top plate 101 with respect to the housing 96.

The guide cover 81 is temporarily seated over the vacuum holder 77 while the holder is mounted to the table 73. A preferred material for the cover 81 is a clear acrylic which helps to monitor the filling of the cavities 84 and 85 with the chips 44. While the table 73 is vibrating and the chips are filling the respective cavities 84 or 85, it is preferred not to draw a vacuum in the chamber 98. It has been found that a pneumatic pull through the passages 102 causes chips 44 with the incorrect orientation of their p-n junctions to locate and lodge above the cavities or partially within the cavities. This erroneous lodging of the chips 44 does not occur when the vacuum pull from the vacuum source is not activated while the chips are being loaded into the cavities 84 and 85.

Excess chips are discharged from an exit port 108 of the channel 91 into a receptacle 109 which may be conveniently placed below the port 108 for that purpose.

Assembly Holder for the Devices

After the cavities 84 and 85 have become occupied by the chips 44, the vacuum source is coupled to the chamber to draw a vacuum and thereby to retain the chips 44 in the cavities. The clamps 80 are now disengaged from the guide cover 81 and the vacuum holder can be moved to a fixture or assembly holder 111, shown in FIGS. 13, 14, 15 and 16, which is used to assemble a plurality of the devices 20 substantially simultaneously in what is referred to as a single batch.

Mass Assembly of the Devices

Figure 13:
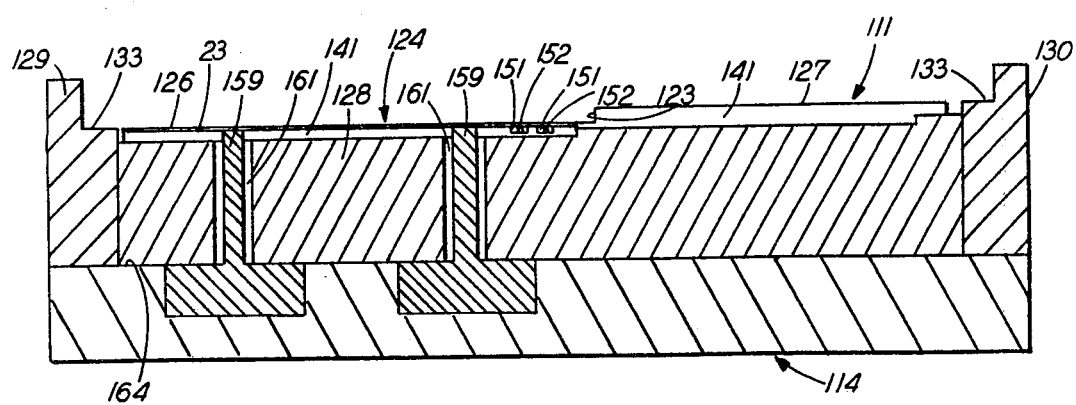
FIG. 13 is a section through a assembly holder used in the mass assembly of the articles of FIG. 1; p
Figure 16:
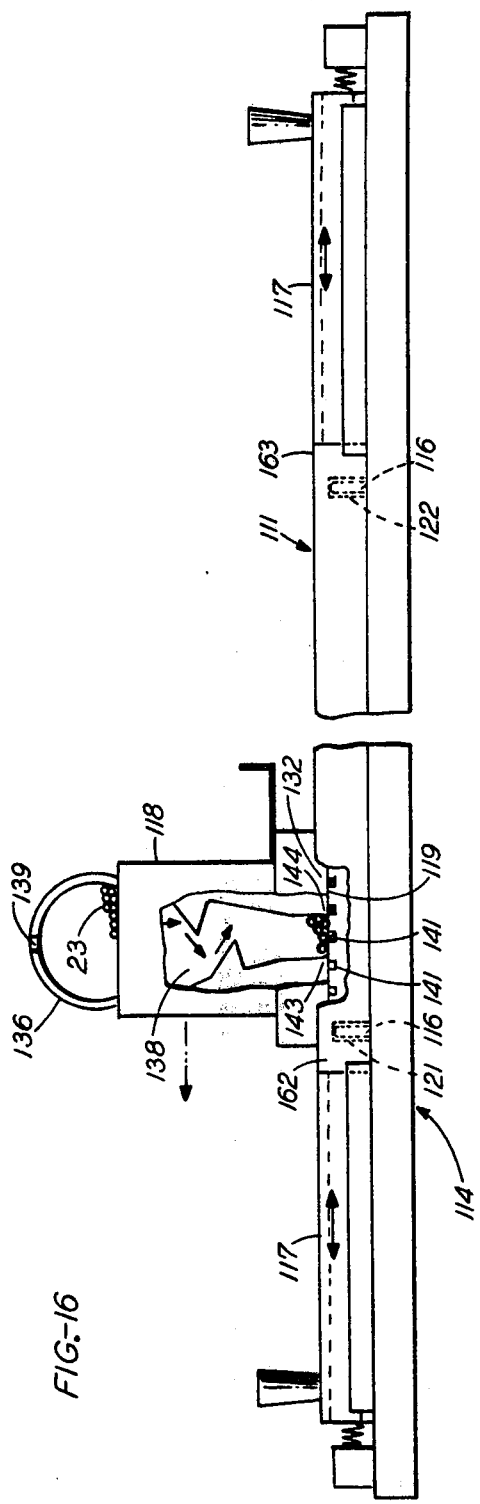
FIG. 16 is a sideview of the holder of FIG. 7 used with a lead loader.

Referring now to FIGS. 16 and 13, there is shown a front view and a cross section, respectively, of the assembly holder 111. The holder 111 accepts during the assembly of a batch of devices 20 a number of the first leads 23 then, for each such lead 23, two of the oppositely oriented chips 44, and thereafter a number of the second leads 24. For each device 20 the chips 44 are placed on top of one end of the lead 23, and the lead 24 is then placed with one end over the two chips 44 substantially as it is shown in FIG. 1.

FIG. 16 shows in general the apparatus involved in loading the holder 111. The holder is located on a base which is designated generally by the numeral 114. Two pins 116 mounted to the base 114 locate the holder 111. A holder extension 117 is slideably mounted at each end of the base 114. The two extensions 117 are spring biased to move toward the center of the base 114 and into contact with each end of the holder 111. A lead dispenser 118 has a machined lower sliding surface 119 which permits it to be moved back and forth over the holder 111 and the extensions 117. The holder 111 has at least one accurately located aperture 121 and one slightly oversized slot 122. The oversized slot permits the holder 111 to be fitted to the extensions 117.

Leads are dispensed to the holder 111 by moving the lead dispenser 118 from one extension 117 across the holder 111. Whenever reference is made to the lead 23 or the lead 24, this is done primarily to identify the first or the second lead placed into the holder 111 for each device. Physically, the leads 23 and 24 are the same in the described application. Of course, it is possible to make one lead shorter than the other. But such a variation is then by choice rather than out of necessity.

Because the chips 44 are placed on top of the lead 23, and then the lead 24 is deposited on top of the chips 44, an offset or step 123 in a top surface 124 is considered to be advantageous. The top surface 124 in the preferred embodiment is consequently divided into a lower level 126 and an upper level 127 with the step 123 delineating the two levels. FIG. 13 shows the two levels 126 and 127 in the section of the holder 111. A body portion 128 of the holder 111 is preferably made of a ceramic or heat resistant material which is not wettable by liquid solder. A lower guide 129 and an upper guide 130 of metal, such as aluminum are mounted to the longitudinal edge of the respective two levels of the body portion 128. The lead dispenser 118 has two opposite guide edges 132 which ride along guide grooves 133 facing each other in each of the guides 129 and 130.

The lead dispenser 118 slides in an off-centered position over the holder 111. To place the first leads 23 into the holder the dispenser 118 rests with one guide edge 132 on the groove 133 of the lower guide 129 and extends from there to approximately the step 123. The opposite guide edge 132 extends laterally from the dispenser to rest in the groove 133 of the guide 130. The manner in which the leads are deposited on the holder 111 is best shown with reference to FIG. 16.

The dispenser 118 has a storage cylinder 136 which holds a quantity of the leads (23 or 24). The cylinder rests in top opening of a staircase chute 138. The leads are dumped through a slot 139 in the cylinder into the chute 138. The dumping is accomplished by merely rotating the cylinder until the slot 139 permits a desired number of leads to fall down the chute 138. Since the bottom of the chute 138 is open the leads would fall out of the chute if it were ever lifted off the surface of the level 126 or 127 against which it is positioned.

The holder 111 has a plurality of device positions located at evenly spaced intervals along its length. Preferably 100 device positions are provided in the holder 111, however a greater or lesser number can be chosen. In FIG. 16 the positions are recognized by grooves 141. When a quantity of the leads 23 or 24 are located in the chute 138 and the dispenser 118 is slideably advanced in the direction of the arrow a lead falls into each of the grooves 141 as each of the grooves 141 becomes exposed by a leading edge 143 of the chute 138. With a single movement of the dispenser 118 from the extension 117 on one side of the holder 111 to the other extension 117 either the grooves 141 on the lower level 126 or on the upper level 127 become filled with leads. Whether the grooves on the lower level 126 or on the upper level 127 become filled depends, of course, on which of the levels the dispenser is slideably moved.

Since the lower surface 119 of the dispenser 118 slides along the surface of the level against which the dispenser is positioned, a trailing edge 144 of the chute 138 pushes all leads within the space of the chute 138 across the upper surface of the holder 111. Both, the leading edge 143 and the trailing edge 144 have inwardly facing knife edges. The inwardly facing edges are intended to slightly lift the leads 23 or 24 which have not yet found one of the grooves 141, as the dispenser moves over the holder 111. Lifting these leads reduces the friction and consequently the force required to slide the dispenser 118 over the holder 111.

It has also been found that the sliding motion of the dispenser 118 jams and stops when a lead 23 or 24 does not completely fall into one of the grooves 141. If the lead partially protrudes from the groove 141, then the trailing edge 144 catches against the protruding portion of the lead. Since the lead itself is caught partially in the groove 141, the lead acts as a key inserted into, and protruding partially from, two adjacent and oppositely facing keyways. The result is that the lead stops the sliding action of dispenser 118.

The inwardly facing knife edges also have been found to maintain the leads in the dispenser 118 in parallel with respect to each other. As long as the leads are maintained in parallel the likelihood of one of the leads becoming partially inserted into one of the grooves 141 is very small.

However, bent leads or other protrusions or edges can also cause one of the leads 23 or 24 to jam the dispenser 118. For instance, when the depths of the grooves 141 is deeper than the diameter or thickness of one of the leads then a second lead can come to rest on top of the first lead and partially protrude into the space of the advancing trailing edge 144. The partially protruding lead would then tend to stop the sliding motion of the dispenser 118. Thus, under normal conditions it would be desirable to maintain the depth of each groove 141 the same as the thickness of the leads to be dispensed.

After the lower leads 23 have been dispensed in the manner described to fill the grooves 141 in the lower level 126 of the top surface 124 of the holder, the chips are transferred from the described vacuum holder 77 to the assembly holder 111. When the vacuum is connected through the connection 99, the chips 44 in the cavities 84 and 85 are retained in the cavities 84 and 85 even when the vacuum holder 77 is turned to face the cavities 84 and 85 downward. The vacuum holder is turned in this manner to face the cavities 84 and 85 downward with the chips 44 located therein, to bring the chips 44 into alignment with chip receiving locations 145 on the assembly holder 111.

Alignment between the two holders is achieved by using the aperture 121 and inserting an alignment pin through the aperture 121 and the aperture 79. FIG. 12 also shows a step 146 in the top surface of the vacuum holder 77. The step 146 is aligned against the step 123 of the assembly holder 111. The combined alignment of the apertures 79 and 121 and the steps 146 and 123 of the vacuum holder 77 and the assembly holder 111, respectively, line up the chips 44 with their receiving locations 145 on the assembly holder 111.

Figure 14:
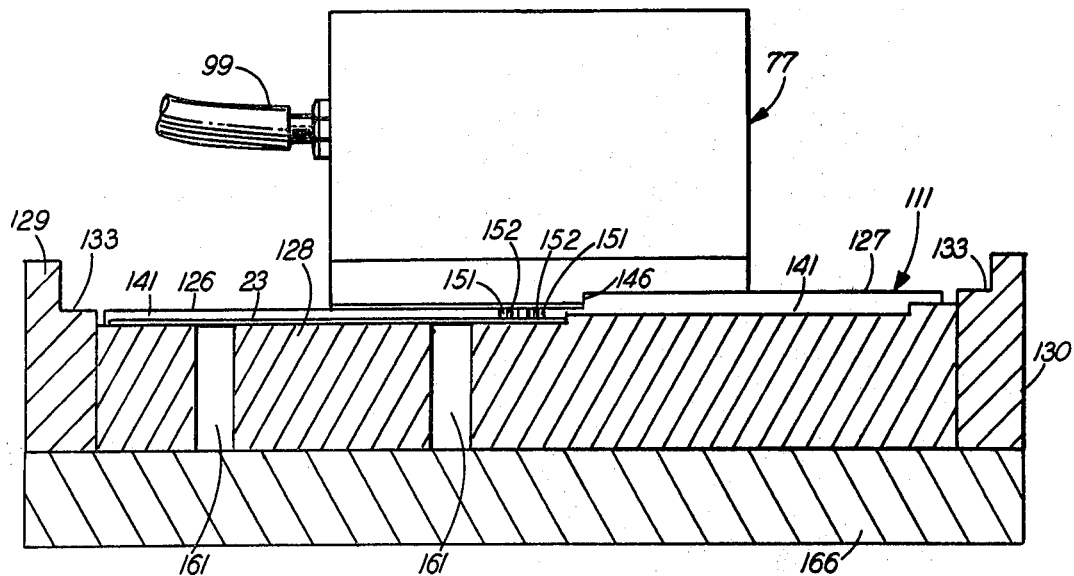
FIG. 14 is a section through the holder of FIG. 7 and a chip vacuum holder moving into position to load the chips into the assembly holder.

When the vacuum holder 77 has been aligned with the assembly holder 111 the vacuum pull to the vacuum holder is turned off. This turnoff causes the chips 44 to be released. The chips 44 become located in their respective receiving locations 145. FIG. 14 shows the vacuum holder 77 in alignment with the assembly holder 111.

Figure 15:
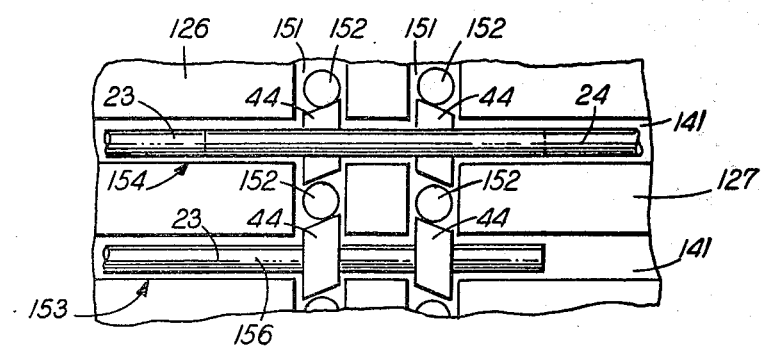
FIG. 15 is a top view showing a portion of the holder of FIG. 13 with chips loaded into the holder.

Referring to FIG. 15, the receiving locations 145 are formed by portions of longitudinally cut grooves 151 in the ceramic body portion 128 of the holder 111. The locations 145 are longitudinally bordered by pins 152 which are evenly spaced between adjacent device assembly locations. FIG. 15 shows an enlarged top view of a portion of the assembly holder 111, the portion showing two adjacent device assembly locations 153 and 154.

The device assembly location 153 shows the lower lead 23 in place in its respective groove 141 in the lower level 126 of the top surface 124. The chips 44 are placed over the lead 23 and are retained in a direction perpendicular to the lead 23 by the adjoining pins 152. The assembly location 154 shows in addition, for illustrative purposes the upper lead 24 assembled into place at the upper level 127 of the holder 111. Normally the leads would be assembled into place by the lead dispenser 118 which would slide between adjacent locations such as the two locations shown. The presence of the lead dispenser in FIG. 15 is eliminated for illustrative purposes.

It must be realized that the chips 44 may become located on the leads 23 in positions other than horizontal, e.g., other than parallel to the direction in which the top surface 124 extends. It therefore becomes desirable to extend the lengths of the pins at least as high as the thickness of the chips 44, but preferably higher, above an uppermost portion 156 of the lead 23.

Referring back to the placing of the leads 23 by the dispenser 118, the depths of the grooves 141 is desirably the same as the thickness of the leads 23. On the other hand, when the uppermost portion 156 of each of the leads 23 is substantially located at the same height as the lower level 126 of the top surface 124, then the pins would preferably extend above the plane of the top surface 124. However this would not be advantageous in that the leads in the dispenser 118 would tend to hang up on the protruding pins to jam further sliding movement of the dispenser 118. A solution to the dilemma is to form the grooves 141 deeper than the thickness of the leads 23. Referring to FIG. 13, two supports 159 are located on the base 114. Two corresponding slots 161 extend through and substantially for the full length of the assembly holder 111 (except for joining end pieces at each end 162 and 163).

The height of the supports is chosen to be less than the dimension between the top of the base 164 and the lower level 126 of the top surface 124 of the holder 111 by one thickness of the leads 23. Thus, when the assembly holder 111 has been placed on the base 114, the two supports or rails 159 prevent any leads 23 dispensed into the grooves 141 in the lower level of the top surface 128 from being underflush with respect to the top surface 128.

If the pins 152 are in this situation kept substantially flush with the lower level 126 of the top surface 124 the movement of the dispenser 118 will not become jammed because a lead hangs up between the trailing edge 144 of the dispenser 118 and the pin 152.

After the leads 23 have been loaded into the grooves 141 of the lower level 126 of the top surface 124, the holder 111 is removed from the base 114 and is placed onto a similar base 166, however one without the rails 159. As a result of the absence of the rails 159, the leads 23 move to the bottom of their slots, raising the pins relative to the uppermost position of the leads. An increased depth of the grooves 141 in the lower level 126 necessitates a similar downward movement of the depths for the leads 24 in the upper level 127 of the holder 111. However the upper level of the top surface 124 can likewise be lowered so that the depths of the grooves 141 in the upper level 127 are no greater than the thicknesses of the leads 24. Consequently, the presence of the rails 159 is needed only for placing the leads 23 into their respective grooves 141.

Of course, other embodiments of the invention need not involve moving the holder from the base 114 including the rails 159 to the base 166 without the rails 159. For instance, the holder can be raised and lowered slightly. Or, the rails can be chosen as movable elements to extend upward into a lead supporting position and then retract downward into an inactive position. In such a case two dispensers 118 are positioned on the extensions 117, one to either side of the holder.

Once the holder 111 is placed on the base, similar to the base 114 but with the movable rails 159, the rails are first moved to their extended position. The leads 23 are then dropped into the grooves 141 by moving the first dispenser 118 across the holder 111 and then back to its initial extension 117. On such a retreating movement of the dispenser 118 nothing of substance changes, since the grooves 141 are already filled with the leads 23.

Thereafter, the rails 159 are lowered and the chips 44 can be placed into the receiving locations 145. In the presently preferred embodiment the rails are deactivated by moving the entire holder 111 to the base 166 as shown in FIG. 14. After the chips 44 have been loaded into the holder 111, the leads 24 can be placed into the grooves 141 in the upper level 127. In the preferred embodiment this is done by a second dispenser 118 associated with the base 166. The second dispenser is located to slide from the extensions 117 across the upper level 127 of the top surface 124.

Soldering the Device

Upon completion of the mechanical assembly of the plurality of devices 20 on the holder 111, the holder is removed from the base 166 and placed on a solder-reflow apparatus 171 (see FIG. 17) which bonds the lead 23, the two chips 44 and the lead 24 into the device. The only assembly operation left after the solder reflow bonding is the plastic encapsulation of each of the devices 20. Plastic encapsulation is done in accordance with known techniques and is not further to be discussed within the scope of this disclosure.

Figure 17:
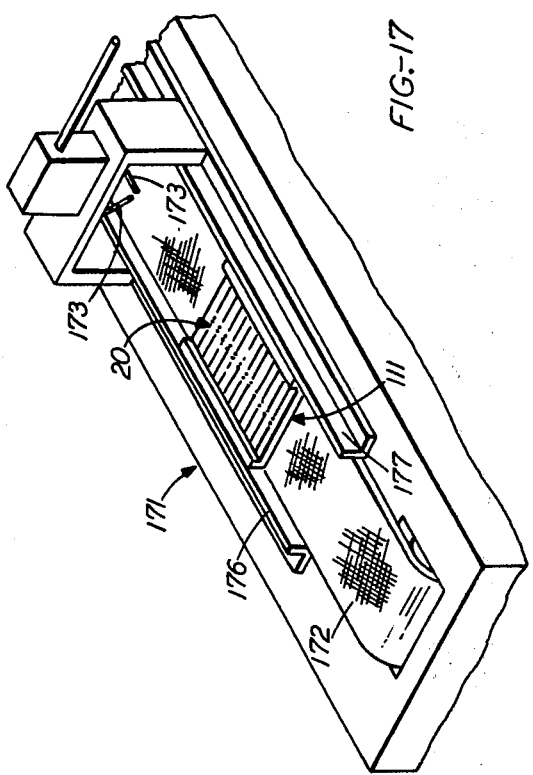
FIG. 17 shows a solder reflow apparatus used to permanently join the articles assembled in the holder.

The solder-reflow apparatus 171 is best described in reference to FIG. 17. The apparatus 171 includes a constant speed endless conveyor band 172 which moves the holder 111 and others like it in sequence past hydrogen flames 173. The leads 23 and 24 have previously been lightly coated with solder. The major surfaces of the chips 44 are preferably gold plated. Gold is easily wetted by solder. In the presence of heat supplied by the hydrogen flames the solder reflows and bonds, upon solidification, the mechanical assemblies in each of the locations into a unit. Lateral guiding such as the guides 176 and 177 provide better control for directing the heat of the hydrogen flames to the assembly sites. The pins 152 are preferably made of a material which will not be wetted by solderflow. Stainless steel or ceramic has successfully been used as such a material.

The above description is for illustrative purposes only and is not intended to limit the scope of this invention. Also various changes and alterations are possible within the spirit and scope of this invention.

We claim:

1. A method of labeling the orientation of directional characteristics extending between two major opposite surfaces of an electronic article, the characteristics terminating in opposite polarities at each of the surfaces, which comprises:
    preselecting an asymmetric surface shape and a mirror image thereof as two mutually distinct geometric surface shapes, each shape to identify one of the polarities; and
    forming edges substantially perpendicular to each of the surfaces to generate at one of the surfaces the asymmetric surface shape identifying the polarity which terminates at such surface, and at the opposite surface the mirror image of the asymmetric surface shape to identify the other one of the polarities.

2. A method according to claim 1 wherein the edges define the major surfaces as rhomboids.

3. A method according to claim 1, wherein the article is a body portion of a semiconductor wafer having defined regions of first and second conductivity types, such regions forming junctions with such directional characteristics which terminate in said opposite polarities at each of said surfaces, and wherein forming edges comprises:
    forming a plurality of spaced cuts through the wafer to define the outline of a plurality of such asymmetric surface shapes in one of the surfaces of the wafer and the mirror image of such plurality of surface shapes in a perpendicular projection of such shapes on the opposite major surface of the wafer, whereby the portions of the wafer bounded by said surface shapes define a plurality of such articles having an orientation of directional characteristics which is uniformly labeled by said surfaces shapes.

4. A method according to claim 3, wherein forming a plurality of spaced cuts comprises:
    forming a first group of parallel cuts which are equally spaced at a first distance;
    forming a second group of parallel cuts which are equally spaced at a second distance and which intersect said first group of parallel cuts at a nonperpendicular angle, whereby said first and second groups of cuts define a plurality of first rhomboids on the one major surface and the mirror image of said first rhomboids on the opposite major surface of the wafer.

5. A method according to claim 4, wherein the semiconductor wafer is of a sheet diffused diode material having a p-n junction located between the two major surfaces of the wafer, and preselecting an asymmetric surface shape comprises:
    selecting the direction in which the first and the second group of cuts are formed with respect to each other, in reference to a facing surface of the wafer; and
    orienting the wafer to face the surface of the wafer having a termination of a preselected polarity of the p-n junction toward the direction from which the cuts are formed.

* * * * *

Dedication 4,253,280.—*Loring E. Du Bois*, Kansas City, and *Lawrence D. Simpson*, Lee Summit, Mo. METHOD OF LABELLING DIRECTIONAL CHARACTERISTICS OF AN ARTICLE HAVING TWO OPPOSITE MAJOR SURFACES. Patent dated Mar. 3, 1981. Dedication filed Oct. 26, 1981, by the assignee, *Western Electric Co., Inc.*

Hereby dedicates to the Public the entire term of said patent.
[*Official Gazette December 29, 1981.*]